United States Patent
Standing et al.

(10) Patent No.: US 8,603,858 B2
(45) Date of Patent: Dec. 10, 2013

(54) METHOD FOR MANUFACTURING A SEMICONDUCTOR PACKAGE

(75) Inventors: Martin Standing, Villach (AT); Paul Ganitzer, Villach (AT)

(73) Assignee: Infineon Technologies AG, Neubiberg (DE)

( * ) Notice: Subject to any disclaimer, the term of this patent is extended or adjusted under 35 U.S.C. 154(b) by 121 days.

(21) Appl. No.: 13/180,630

(22) Filed: Jul. 12, 2011

(65) Prior Publication Data

US 2013/0017651 A1    Jan. 17, 2013

(51) Int. Cl.
*H01L 21/00*    (2006.01)

(52) U.S. Cl.
USPC ........................................................ 438/106

(58) Field of Classification Search
None
See application file for complete search history.

(56) References Cited

U.S. PATENT DOCUMENTS

| | | | |
|---|---|---|---|
| 6,991,966 B2 | 1/2006 | Tuominen | |
| 7,294,529 B2 | 11/2007 | Tuominen | |
| 2007/0138488 A1* | 6/2007 | Tasch et al. | 257/88 |
| 2007/0216019 A1* | 9/2007 | Hsu | 257/700 |
| 2008/0096312 A1* | 4/2008 | Law et al. | 438/106 |
| 2010/0308737 A1 | 12/2010 | Hilgers | |

* cited by examiner

*Primary Examiner* — Charles Garber
*Assistant Examiner* — Andre' C Stevenson

(57) ABSTRACT

A method for manufacturing a semiconductor package, the method comprising providing a substrate having opposite first and second surfaces and having one or more through openings formed therethrough from the first to the second surfaces at predefined positions; providing at least one first die having first and second opposite surfaces and having one or more first contact terminals on the first surface of the at least one first die; placing the at least one first die with the first surface thereof on the first surface of the substrate, with an adhesive applied therebetween outside the one or more through openings, such that the one or more through openings are aligned to the one or more first contact terminals, whereby a die assembly having correspondingly opposite first and second surfaces is formed; providing the first surface of the die assembly with a first plating layer of an electrically conductive plating material to electrically contact the one or more first contact terminals, wherein the plating material of the first plating layer extends in the through openings to electrically contact the one or more first contact terminals therethrough.

23 Claims, 12 Drawing Sheets

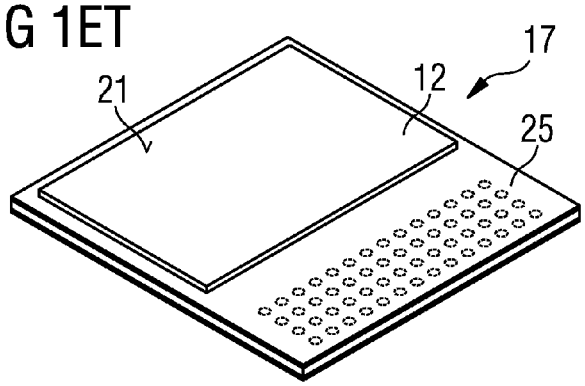
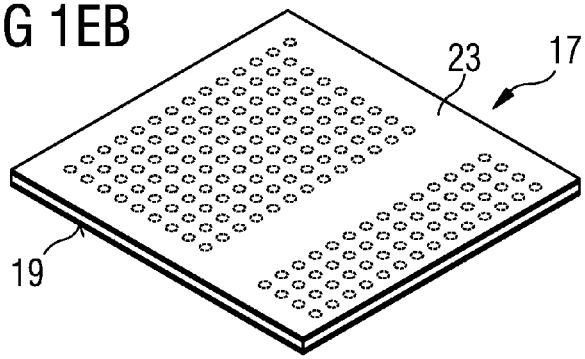
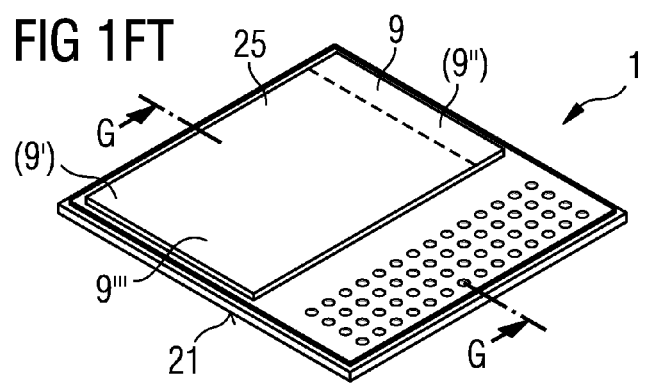
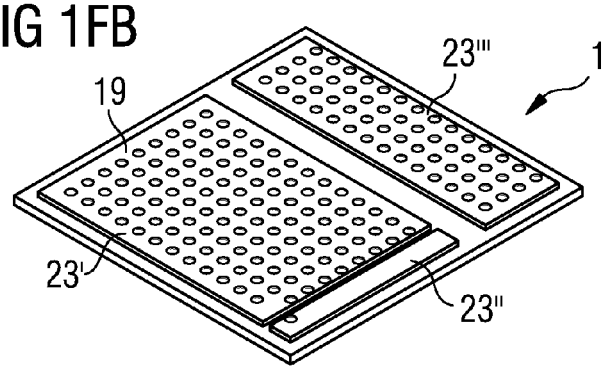

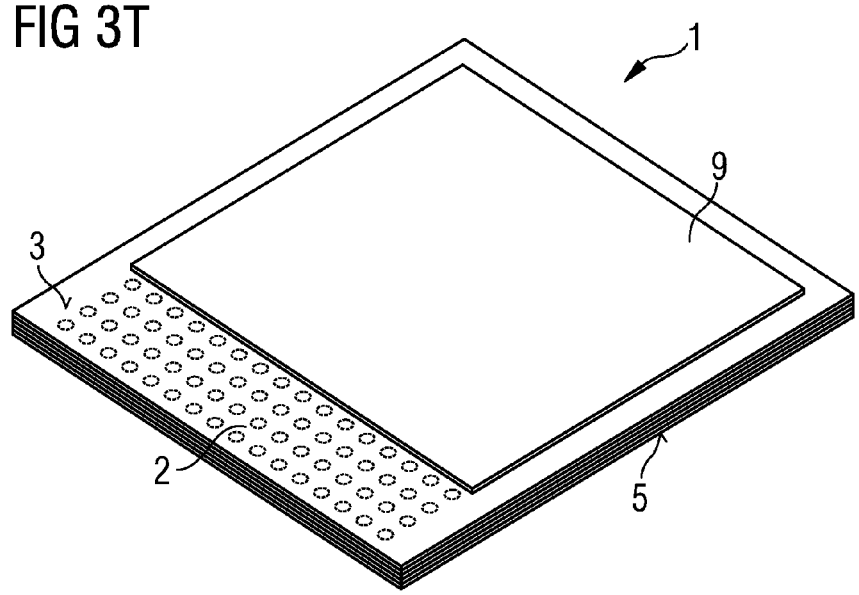
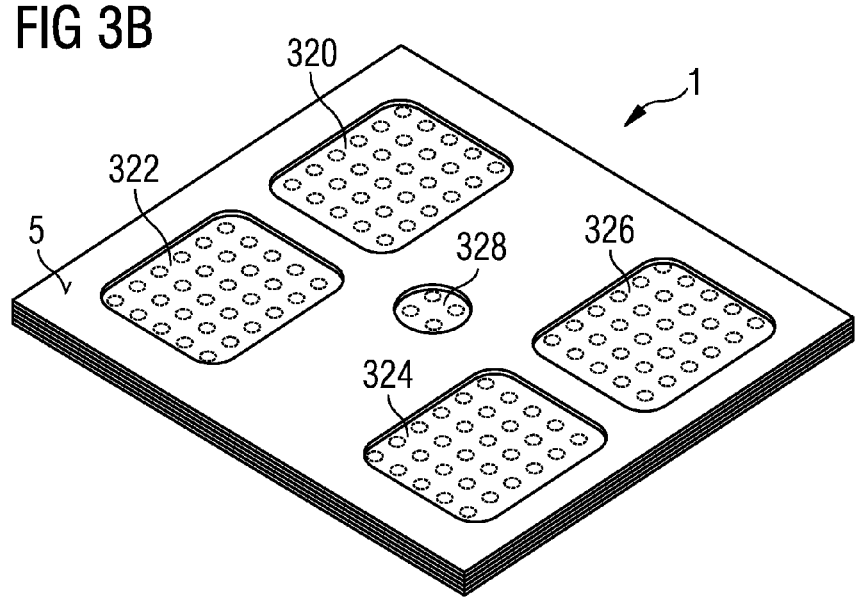

FIG 5
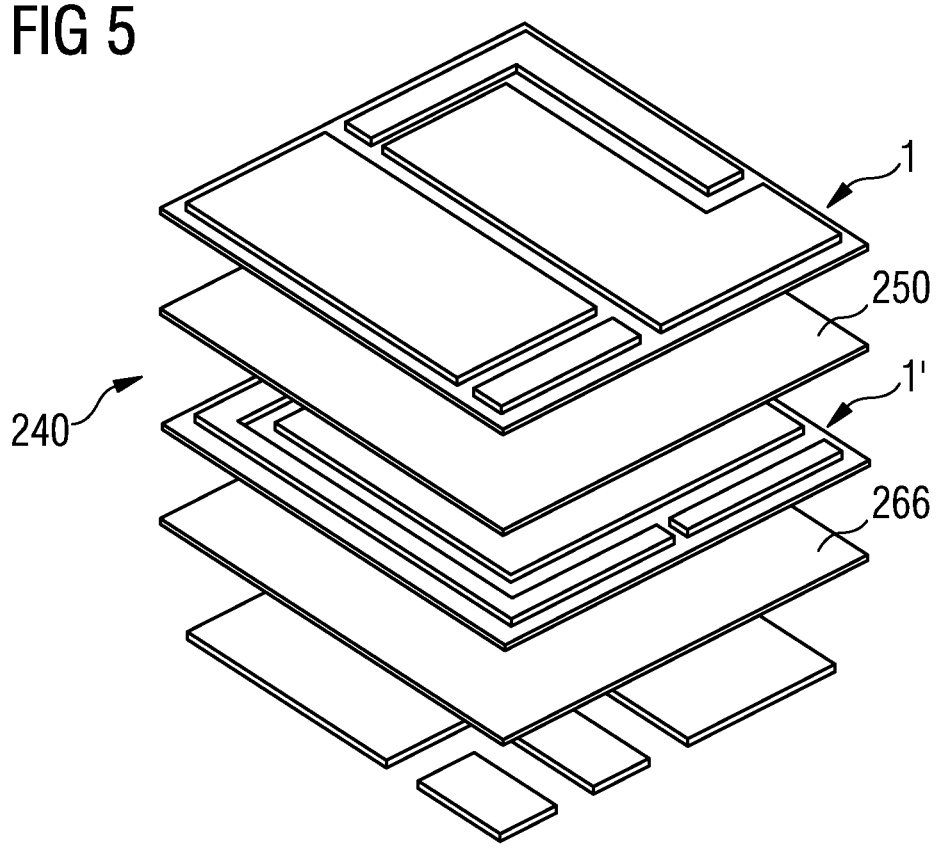
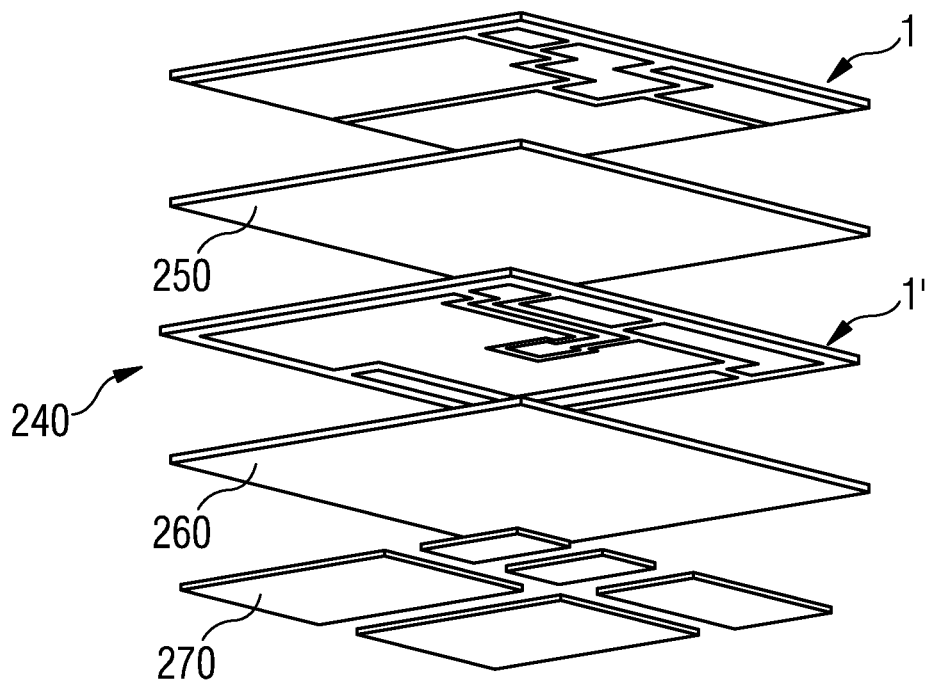

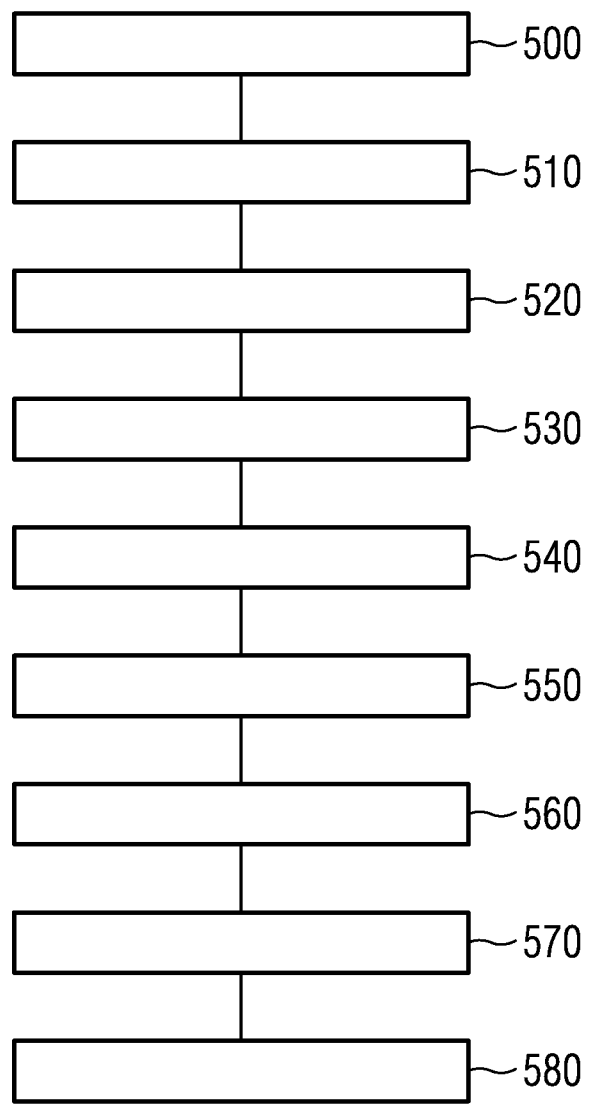

US 8,603,858 B2

METHOD FOR MANUFACTURING A SEMICONDUCTOR PACKAGE

TECHNICAL FIELD

Various embodiments generally relate to a method for manufacturing a semiconductor package.

BACKGROUND

Today's semiconductor packages need to give outstanding performance with reduced cost. Redistribution of the device pads allows the housing of a smaller die within the package, which significantly reduces the product cost. Designs must continue to push the boundaries of performance and lever more efficient manufacturing methods to achieve cost reductions.

A conventional generation of packages has evolved to a level where the package no longer significantly impedes the performance of the device. However, there is still potentially room to reduce product cost and simplify processing for this generation of packages, which should include redistribution to expand the pad area.

SUMMARY

Various embodiments provide a method for manufacturing a semiconductor package, the method including providing a substrate having opposite first and second surfaces and having one or more through openings formed therethrough from the first to the second surfaces at predefined positions; providing at least one first die having first and second opposite surfaces and having one or more first contact terminals on the first surface of the at least one first die; placing the at least one first die with the first surface thereof on the first surface of the substrate, with an adhesive applied therebetween outside the one or more through openings, such that the one or more through openings are aligned to the one or more first contact terminals, whereby a die assembly having correspondingly opposite first and second surfaces is formed; providing the first surface of the die assembly with a first plating layer of an electrically conductive plating material to electrically contact the one or more first contact terminals, wherein the plating material of the first plating layer extends in the through openings to electrically contact the one or more first contact terminals therethrough.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 1A to 1FB show perspective views for explaining a method for manufacturing a semiconductor package according to various embodiments;

FIGS. 3T and 3B show perspective views of a semiconductor package from top and from bottom, respectively, manufactured using a method according to various embodiments;

FIGS. 4 and 5 respectively show perspective views of semiconductor packages manufactured using a method according to various embodiments; and FIG. 6 shows a schematic flow chart for explaining a method for manufacturing a semiconductor package according to various embodiments.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

A method for manufacturing a semiconductor package 1 (cf. FIGS. 1FT, 1FB and 1G) according to various embodiments will now be described with reference to FIGS. 1A to 1G.

Figure 1A:
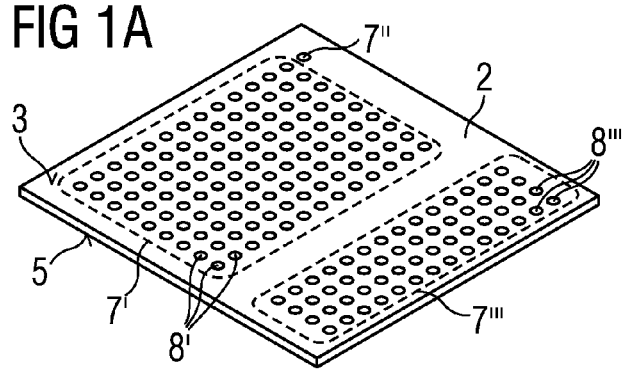

As can be seen in FIG. 1A, a panel-shaped, plate-shaped or film-shaped substrate or carrier 2 is provided, which includes a first surface 3 (here, for example, an upper surface), and a second surface 5 (here, for example, a lower surface) opposite to the first surface 3. The substrate 2 is provided with a plurality of through holes 7', 7", 7' extending through the substrate 2 from the first surface 3 to the second surface 5. In various embodiments, the plurality of through holes 7', 7", 7' may include three through holes 7', 7", 7''' associated to die contact terminals 9', 9", 9''', respectively, of a die 9 (in this embodiment a first, second and third contact terminal 9', 9'", 9' providing source, gate and drain contacts, respectively, of for example, a MOSFET) to be attached on the substrate 2 as will be discussed further below (cf., for example, FIGS. 1FT and 1G). It is to be mentioned that any other number of through holes may be provided in various embodiments such as e.g. four, five, six, seven, eight, nine, ten, or even more through holes.

Further according to various embodiments, among the three through openings 7', 7", 7''', a first through opening 7' (associated to the source contact terminal 9' of the die 9) may include a plurality of sub through openings 8' defining a first set of sub-openings 8', the outer envelope of which defining the outer circumference of the first through opening 7', a second through opening 7" (associated to the gate contact terminal 9" of the die 9) may be formed as a single through opening (or the second through opening 7" may also be seen as being defined by a second set of sub through openings, the second set including only one sub through opening), and a third through opening 7' (associated to the drain contact terminal 9' of the gate 9) may include a plurality of sub through openings 8' defining a third set of sub-openings 8''', the outer envelope of which defining the outer circumference of the third through opening 7'''.

The material of the substrate 2 may be a plastic material such as a high thermally resistant semi-rigid or rigid material such as polyimide, peek, high TG epoxy resin, bismaleimide, glass reinforced epoxy resin, PTFE, carbon and or Kevlar reinforced resins, or polyester (this also applies for the other embodiments). The substrate thickness may be in the range from about 25 µm to about 1 mm, or may be in the range from about 25 µm to about 250 µm, or may be in the range from about 20 µm to about 100 µm. The through openings or through holes 7', 7", 7' may be provided before placing the die 9 on the substrate 2 at positions which are associated to the corresponding contact terminals 9', 9''', 9' of the die 9 to be placed on the substrate 1, wherein the first through opening 7' (with its corresponding sub through openings 8') and the second through opening 7'' are arranged at positions which will be overlapped by the die 9 placed on the substrate, wherein these positions form/define a pattern complying to the pattern of the first and second contact terminals 9' and 9''' (source and gate), respectively, of the die 9, so that the die 9 can be placed on the substrate with its first and second contact terminals 9' and 9''' being aligned to and facing the correspondingly associated plurality of through openings 7', 7'' (here the first and second through openings 7', 7''). The third through opening 7' (with its corresponding sub through openings 8'') may be arranged at a position which will not be overlapped by the die 9 when placed on the substrate 2. As will be described further below, the third through opening 7' may serve the provision of an electrical through contact of the third contact terminal 9' (drain contact terminal) from the first surface 3 to the second surface 5 of the substrate 5. In various embodiments, the sub through openings 8', 8' of the first and third through openings 7', 7' are of circular shape, and the first and third through openings 7' and 7' (that is, the circumferential envelopes thereof) are of rectangular shape. The through openings 7', 7'' and 7' may each be formed as a single opening of, for example, circular, oval, rectangular or any other appropriate geometrical shape, wherein the shapes of the through openings 7', 7'', 7' may be generally the same or may be different from each other. In various embodiments, one or more of the through openings 7', 7'', 7' may be formed as an elongated slot or may include one or more elongated slots as sub through opening(s). The through openings 7', 7'', 7' and correspondingly the sub through openings 8', 8' may be provided via mechanical drilling, laser drilling, punching or water-jet cutting. The third through opening 7' to be arranged laterally outside of the die may also be formed after the die 9 has been placed and bonded to the substrate 2.

Figure 1B:
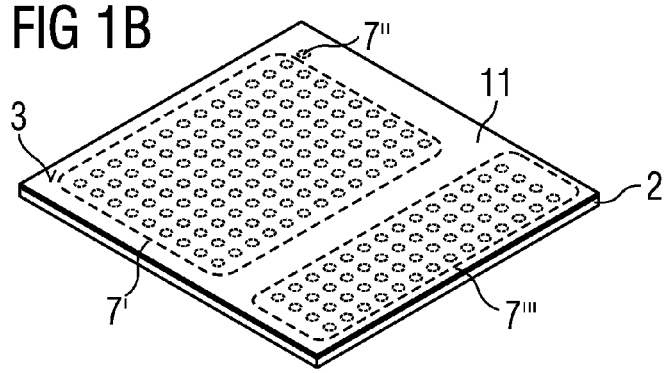

As can be seen from FIG. 1B, an adhesive 11 may be applied to the upper surface 3 of the substrate 1, wherein the adhesive 11 may alternatively or additionally be applied to a mounting surface 13 of the die 9 (which is a first surface 13 of the die as described further below) facing the first surface 3 of the substrate 2 when the die 9 is being or is mounted to the substrate 2. The adhesive 11 may be applied such as to cover the wholly available surface area of the first surface 3 of the substrate 2 outside the through openings 7', 7'', 7'. The adhesive 11 may also be applied such as to only cover pre-defined portions or parts of the wholly available surface area of the first surface of the substrate 1 outside the plurality of through openings 7, 7'', 7'''.

Figure 1C:
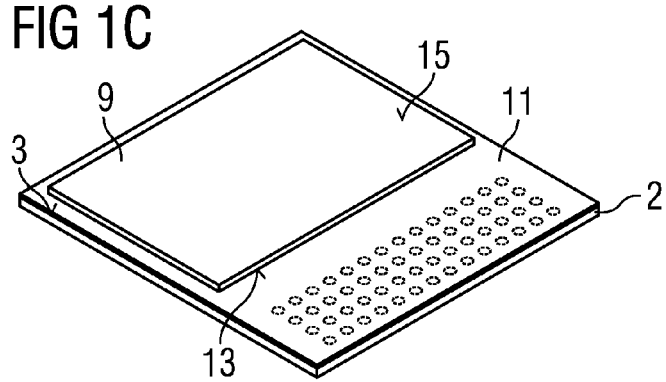

As can be seen from FIG. 1C, after the formation of the plurality of through openings 7', 7'', 7' and the application of the adhesive 11 on the substrate 2, the die 9 which has opposite first and second surfaces 13, 15 (here provided us lower and upper surfaces 13, 15, respectively) is placed, with its first surface 13, on the first surface 3 of the substrate 2 with the adhesive 11 applied therebetween. The die 9 is placed on the substrate 2 such that the first and second contact terminals 9', 9''' provided on the first surface 13 of the die 9 are aligned to the correspondingly associated plurality of through openings 7, 7'' or to the correspondingly associated part of the overall plurality of through openings 7', 7'', 7''', here to the first and second through openings 7', 7''. That is, in various embodiments, the first and second contact terminals 9', 9''' of the die 9, when seeing onto the first surface 13 of the die 9, form a terminal pattern, to which the pattern of the first and second through openings 7', 7'' corresponds.

The adhesive 11 may be a thermo-setting material that will be solid at room temperature. The adhesive 11 may be deposited on the first surface 3 of the substrate 2 and/or on the first surface 13 of the die 9 via printing (screen or stencil), roller coating or spraying. The adhesive 11 may contain a solvent to reduce its viscosity to facilitate the depositing process. During the bonding process the adhesive 11 may be warmed to reduce viscosity to a level where its surface is tacky. The die 9 is then held in place as the adhesive 11 re-solidifies on cooling.

In this configuration, that is, with the first and second contact terminals 9', 9''' which here represent source and gate, respectively, facing the substrate 1, the die 9 will be bonded to the substrate 2 so as to form a die assembly 17 having opposite first and second sides or surfaces 19, 21 (here lower and upper surfaces, respectively). Although in various embodiments, the first and second die terminals 9' and 9''' are provided on the first surface 13 of the die 9 facing the substrate 1, there may also be configurations, in which the first to third contact terminals 9', 9''', 9' are all provided on the first surface 13 of the die 9, facing the substrate 2, or on the second surface 15 of the die 9, facing away from the substrate 2. The first and second contact terminals 9', 9''' may also be provided on the second surface 15 of the die 9 facing away from the substrate 1, and the third contact terminal 9' of the die 9 may be provided on the first surface 13 of the die 9 facing the substrate 2. For example, on the first side 3 of the substrate 2 the first and second contact terminals 9', 9''' (for example, source and gate) of the die 9 or of a plurality of dies 9 may be provided, that is the first and second contact terminals 9; 9''' face the first side 3 of the substrate 2 and the third contact terminal 9' (for example drain) of the respective die 9 on the first side 3 of the substrate 2 faces away from said first side 3, and on the second side 5 of the substrate 2 one or more additional dies may be provided with a third contact terminal (for example drain) of the respective additional die facing the second side 5 of the substrate and with first and second contact terminals (for example source and gate) of the respective additional die facing away from the substrate. These additional dies may otherwise generally be of a type as described for the dies 9 on the first side 3 of the substrate. A photo-imaging dielectric may be introduced on the second side 5 to define through openings of the respective additional die with the drain facing the substrate 2, wherein these through openings are generally of the type as for example the through openings 7', 7'' described in connection with the first and second contact terminals 9', 9''' of the respective die 9 on the first side 3 of the substrate. There may also be other types of dies 9 having only two contact terminals, such as diodes, wherein the two contact terminals may be both arranged on the first surface 13 of the die 9 facing the substrate 1, or may be both arranged on the second surface 15 of the die 9 facing away from the substrate 2, or may be individually arranged on the first and second surface 13, 15, respectively. The type of die(s) 9 may also be IGBT, lateral semiconductor devices, ICs driver ICs, sensor devices etc.

Further, as will also be explained in connection with other embodiments of the invention further below, there may be provided more than one die 9 on the substrate 1, wherein one or a plurality of dies 9 of different and/or same type may be arranged on the first surface 13 of the substrate 1, and/or wherein one or a plurality of dies 9 of different and/or same die type may be arranged on the second surface 15 of the substrate 2. In case a plurality of dies 9 are provided on the first and/or the second surface 13, 15 of the substrate 1, there are provided corresponding through holes, such as the through 7', 7'', 7''', in the substrate 2 in a pattern mating the patterns of contact terminals on those surfaces of the dies 9, which are provided as the mounting surfaces of the dies 9 to be placed on a corresponding surface (such as the first and/or second surface 3, 5) of the substrate 1.

Figure 1D:
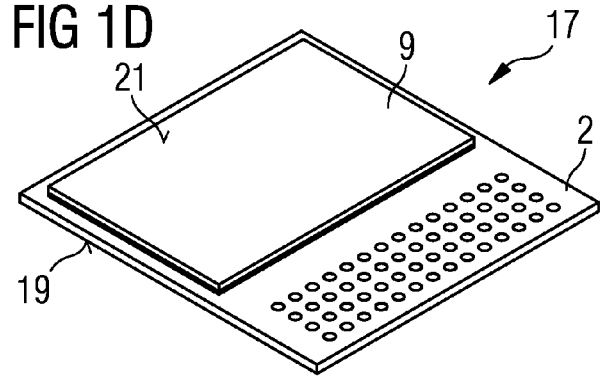

The die assembly 17 as shown in FIG. 1D may have the exceeding adhesive 11 removed from the substrate 2 so that there remains only adhesive 11 between the substrate 2 and the die 9. Said exceeding adhesive 11 may be removed by means of a solvent or an aqueous developing process. The remaining adhesive 11 between the die 9 and the substrate 2 may be cured to make the bond therebetween permanent.

Figure 1G:
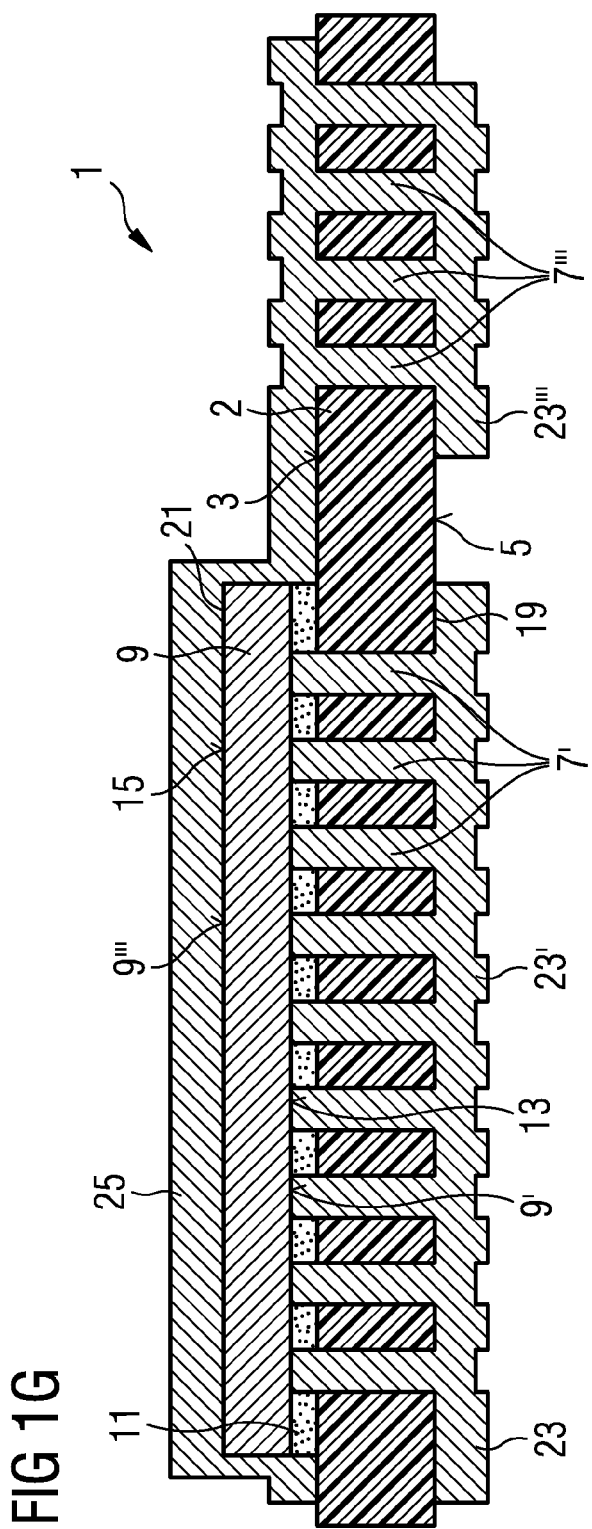
FIG. 1G shows a cross section along the line G-G of FIG. 1FT.

As can be seen from FIGS. 1ET, 1EB and FIG. 1G which show the die assembly 17 from top (view onto the second surface 21 of the die assembly 17), from bottom (view onto the first surface 19 of the die assembly 17) and in a cross-section along line G-G of FIG. 1FT, respectively, the die assembly 17 may be provided with first and second electrically conductive plating layers 23, 25 on its first and second surfaces 19, 21, respectively, each of the first and second electrically conductive plating layers 23, contacting the correspondingly associated contact terminals 9', 9'', 9''', wherein the first plating layer 23 extends through the first and second through openings 7' and 7'' in the substrate 2 to directly electrically contact the first and second contact terminals 9' and 9'' (here source and gate), respectively, through the substrate 2 and extends into and within the third through opening 7''' in the substrate 2 to directly electrically contact the material of the second plating layer 25 on the second surface 21 of die assembly 17, which second plating layer 25 directly electrically contacts the third contact terminal 9''' (here drain) of the die 9 on the second surface 21 of the die assembly 17 and extends into and within the third through opening 7''' to correspondingly contact the material of the first plating layer 23 on the first surface 19 of the die assembly 17.

Each of the plating layers 23, 25 may include a seed layer sputtered, evaporated or electro-less plated to the first and second surfaces or sides 19, 21 of the die assembly 17 and providing for the initial electrical contact with the corresponding contact terminals 9', 9'' and 9' on the first and second surfaces 13 and 15 of the die 9. In this respect, it may be possible to use a die 9 (or dies 9) with no metallization (back metallization) on the second surface 15 of the (respective) die 9, facing away from the substrate 2, since the second plating layer 25 could form such a (back) metallization. In case of using such seed layers, the seed layers may be finally plated up to form the final plating layers 23, 25 of the required thickness, which may be in a range of a few microns, such as e.g. in a range from about 1 μm to about 3 μm, through to 10's microns, such as e.g. in a range from about 100 μm to about 500 μm.

As can be seen from FIGS. 1FT and 1FB, which show the final semiconductor package 1 from top (onto the second surface 21 of the die assembly 17) and from bottom (onto the first surface 19 of the die assembly 17), respectively, and from FIG. 1G, the first and second plating layers 23, 25 may both be etched to remove material therefrom to, for example, confine the second plating layer 25 and to provide individual contact pads 23', 23'', 23' from the first plating layer 2, (individually) associated to the contact terminals 9', 9'', 9''', respectively, (in this case, source, gate and drain) of the die 9. (In FIG. 1FT the reference signs 9' and 9'' are put in parentheses in order to indicate that the corresponding contact terminals are on the bottom side of the die 9 and, hence, are not visible in this view). As can be seen from FIGS. 1FB and 1G, in various embodiments, all of the contact pads 23', 23'', 23' may be located on the same side of the die assembly and, hence, of the semiconductor package 1, which side corresponds to the first surface 19 (here, bottom surface) of the die assembly 17.

FIGS. 2A to 2J disclose perspective views for explaining a method for manufacturing a semiconductor package 1 (cf., for example, FIG. 2J) according to various embodiments.

Figure 2A:
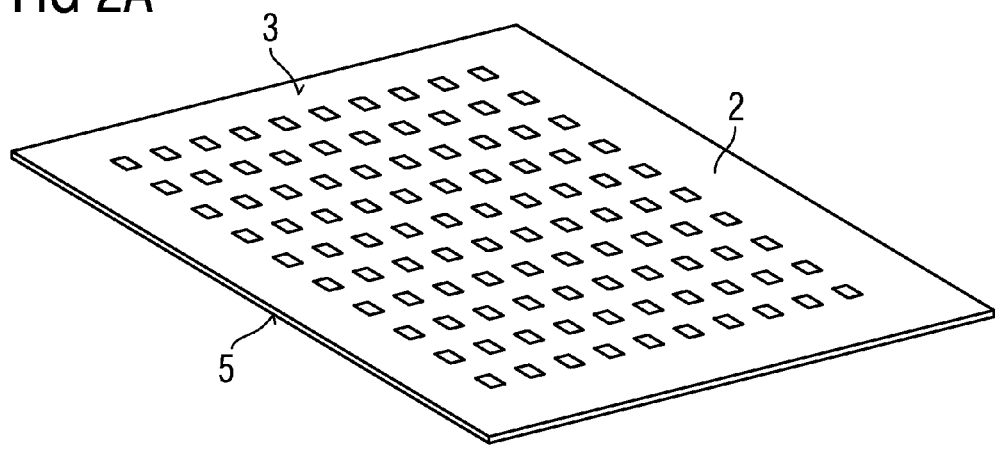
FIGS. 2A to 2J show perspective views for explaining a method for manufacturing a semiconductor package according to various embodiments.
Figure 2B:
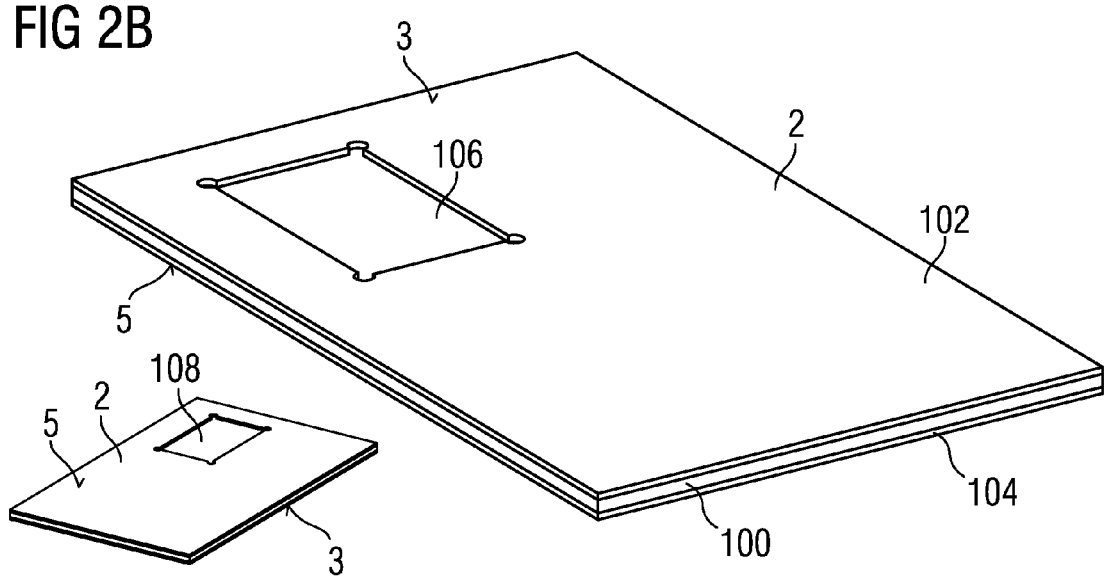

With reference to FIGS. 2A and 2B, according to the method of various embodiments, a panel-shaped, plate-shaped or film-shaped substrate or carrier 2 is provided, which may include a first surface 3 (here, for example, an upper surface), and a second surface 5 (here, for example, a lower surface) opposite to the first surface 3. (FIG. 2B shows the substrate from top (larger section) and bottom views (smaller section indicated as Reverse). The substrate 2 in various embodiments may be of the type of a relatively standard PCB core and may include a core 100 of, for example, glass reinforced resin, polyimide or PTFE, and an electrically conductive layer 102, 104 (first and second conductive layers 102, 104), for example in the form of a copper foil on each surface of the core 100, corresponding to the first and second surfaces 3, 5 of the substrate 2. The core 100 may have a thickness in the range from about 25 μm to about 1 mm, or for example, in the range from about 25 μm to about 250 μm, or for example in the range from about 50 μm to about 100 μm.

As can be seen from FIG. 2B, the first and second conductive layers 102, 104 are recessed down to the core 100, for example via etching, to create recesses or pockets 106, 108, correspondingly exposing the core 100 of the substrate 100. Here, a first recess 106 is formed on the first surface 3 of the substrate 1, and a second recess 108 is formed on the second surface 5 of the substrate 1. The recesses, here the first and second recesses 106, 108, form die accommodating recesses for receiving or accommodating a correspondingly associated die 9, 190 (cf. FIG. 2D), here first and second dies 9, 190. The circumferential shape of the respective recess 106, 108 may comply with the corresponding circumferential shape of the associated die 9, 190 to be placed in the respective recess 106, 108. The respective thickness of the first and second conductive layers 102, 104 may be the same or smaller than the corresponding thickness (cross to the surfaces 3, 5 of the substrate 2) of the respective one of the first and second dies 9, 190.

Figure 2C:
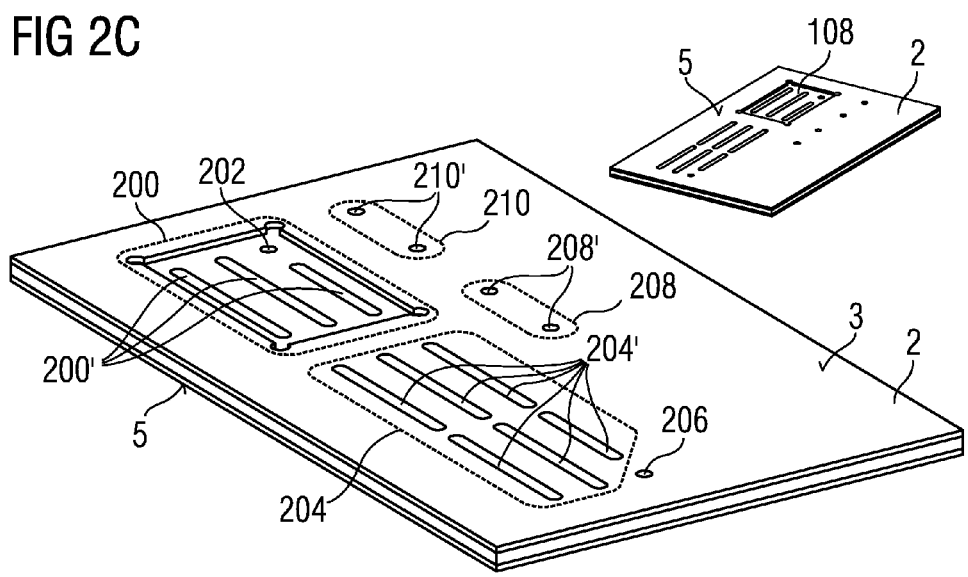

As can be seen in FIG. 2C, a plurality of through openings or through holes 200, 202, 204, 206, 208 and 210 are provided in the substrate 2 extending from the first surface 3 to the second surface 5. In various embodiments, the plurality of through openings 200, 202, 204, 206, 208 and 210 may include a first through opening 200, within the first recess 106, provided as a set of sub through openings 200', here in the form of elongated slots arranged in parallel to each other, a second through opening 202, within the first recess 106, provided as a single through opening 202, here in circular shape, a third through opening 204, within the second recess 108, provided as a set of sub through openings 204', here in form of elongated slots arranged in parallel to each other and each being interrupted once along their length, a fourth through opening 206, within the second recess 108, provided as a single through opening, here in form of a circular opening, a fifth through opening 208, outside the first and second recesses 106, 108, here in the form of two circular sub through openings 208', and a sixth through opening 210, outside the first and second recesses 106, 108, here in the form of two circular sub through openings 210'.

As will be explained further below, the first and fifth through openings 200 and 208 may be associated to a source contact terminal 9' of the first die 9, the second and sixth through openings 202 and 210 are associated to a gate contact terminal 9''' of the first die 9, the third through opening 204 is associated to a source terminal 190' of the second die 190, the fourth through opening 206 is associated to a gate contact terminal 190" of the second die 190, and the fifth through opening is (additionally) associated to a drain contact terminal 190' of the second die 190. The first and second dies 9, 190 each may, for example, be a metal oxide semiconductor field effect transistor (MOSFET) or another type of field effect transistor (FET) such as e.g. another type of power FET.

The plurality of through openings 200, 202, 204, 206, 208 and 210 may be formed in the substrate 2 in a manner and may be of a type as described in connection with the embodiment of FIGS. 1A to 1G. As in the embodiment of FIGS. 1A to 1G, the plurality of through openings 200, 202, 204, 206, 208 and 210 are formed before the dies 9, 190 are placed on and bonded to the substrate 2.

After having the through openings 200, 202, 204, 206, 208 and 210 formed in the substrate 2, an adhesive, such as a glue, such as an epoxy resin based glue, is applied to the first and second surfaces 3 and 5 of the substrate 2 within the first and second recesses 106 and 108 and outside the corresponding plurality of through openings 200, 202, 204 and 206 provided within said recesses 106, 108, and also outside the remaining through openings 208 and 210 provided in the substrate 2 outside the recesses 106, 108. In this respect, outside the through openings may mean that the through openings shall be kept free from adhesive in order to allow an electrical through connection therethrough as will be described in further detail below. The adhesive may also be any other appropriate adhesive, such as acrylate based glue, or cyano-acrylate, silicone based, polyurethane, or polyimide based. In addition, fillers or solvent may be incorporated into the adhesive in order to, for example, adjust photo-imaging characteristics and/or viscosity characteristics of the adhesive. The adhesive may be applied to the first and second surfaces 3 and 5 of the substrate 2 as described for the previous embodiment, that is, for example, by means of stencil printing, jetting (ink jet), photo-imaging, transfer printing, etc. The glue pattern may be similar to the shape (negative shape) of the aperture structure or aperture pattern of the (correspondingly associated) plurality of through openings 200, 202, 204 and 206 or may also be applied only at certain designated positions outside the (correspondingly associated) plurality of through openings 200, 202, 204 and 206.

Figure 2D:
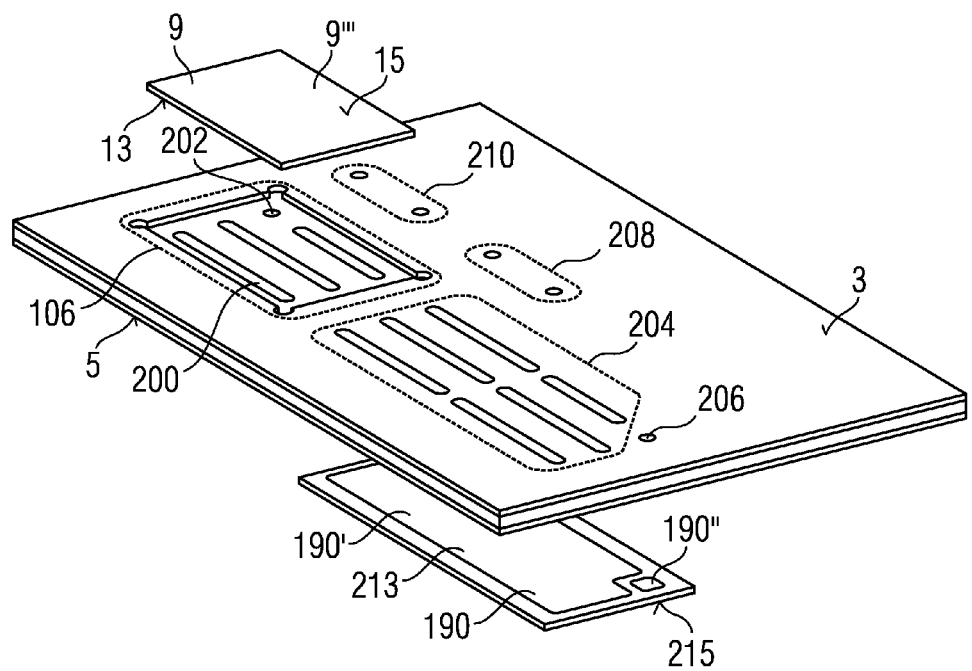
Figure 2E:
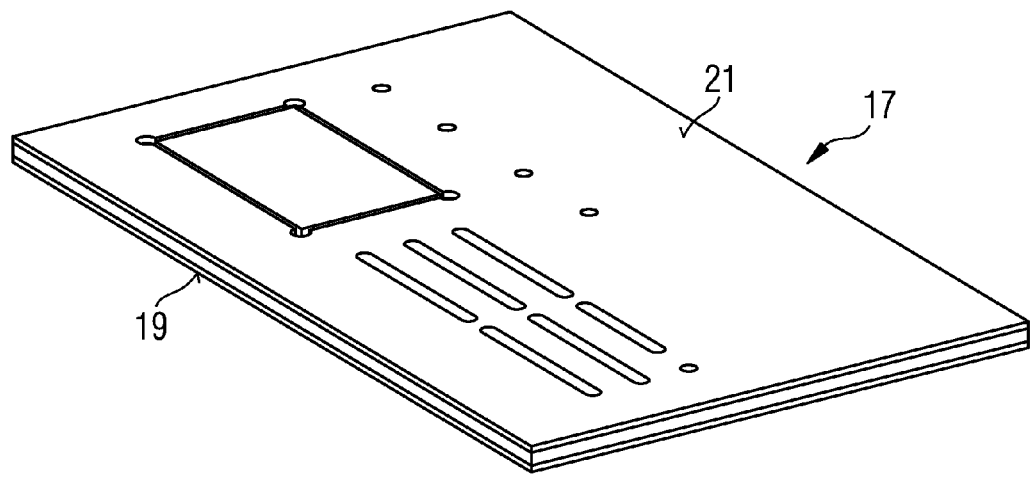
Figure 2F:
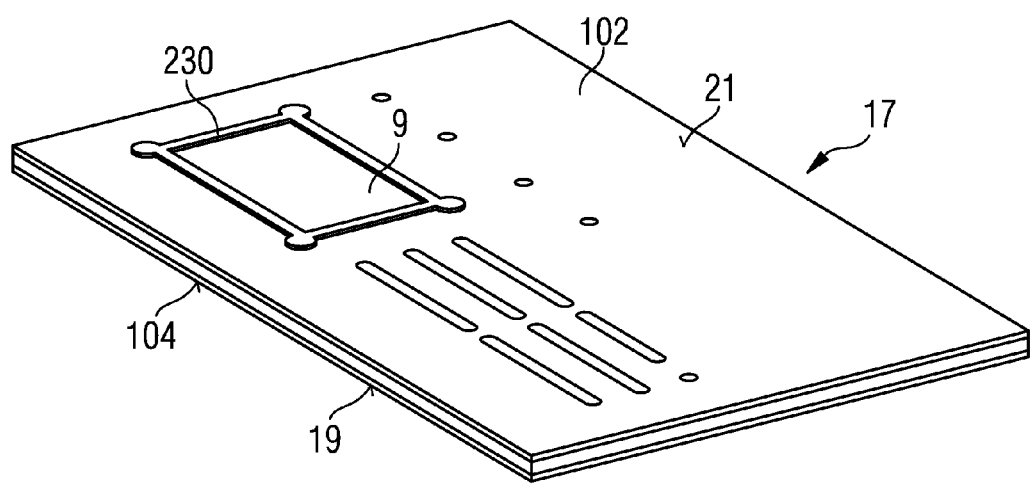

As can be seen from FIG. 2D, after having the through openings 200, 202, 204, 206, 208 and 210 formed in the substrate 2 and after having provided the adhesive on the first and second surfaces 3, 5 of the substrate 2, the first die 9 is placed, with a first surface 13 thereof facing the first surface 3 of the substrate 2, in the first recess 106 such that the source contact terminal 9' (cf. FIGS. 2G and 2H, respective small image) of the first die 9 is aligned with the first through opening 200 and that the gate contact terminal 9" (cf. FIGS. 2G and 2H, respective small image) of the first die 9 is aligned with the second through opening 202. To this end the first and second through openings 200, 202 have been formed in a pattern (envelope pattern of the through openings 200, 202) matching the terminal pattern of the source and gate contact terminals 9', 9" formed on the first surface 13 of the first die 9. The second surface 15 of the first die 9, which is opposite the first surface 13 of the first die 9, is provided as drain contact terminal 9' of the first die 9, or the drain contact terminal 9' is formed on said second surface 15 of the first die 9. Additionally, as can be further seen from FIG. 2D, after having the through openings 200, 202, 204, 206, 208 and 210 formed in the substrate 2, the second die 190 is placed, with a first surface 213 thereof facing the second surface 5 of the substrate 2, in the second recess 108 such that the source contact terminal 190' of the second die 190 is aligned with the third through opening 204 and that the gate contact terminal 190" of the second die 190 is aligned with the fourth through opening 204. To this end the third and fourth through openings 204, 206 have been formed in a pattern (respective envelope pattern of the through openings 204, 206) matching the terminal pattern of the source and gate contact terminals 190', 190" formed on the first surface 213 of the second die 190. The second surface 215 of the second die 190, which is opposite the first surface 213 of the second die 190, is provided as drain contact terminal 190' (cf. FIG. 2H, small image) of the second die 190, or the drain contact terminal 1909' is formed on said second surface 215 of the second die 190.

As will also be described further below, the fifth through opening 208 is associated to both the drain contact terminals 190' of the second die 190 and the source contact terminals 9' of the first die 9 (cf. FIG. 2J, small image, reverse, L-out). In this respect, the drain contact terminals 190' of the second die 190 and the source contact terminals 9' of the first die 9, which will be through connected through the first through opening 200 from the first surface 3 (below/overlapped by the first die 9) to the second surface 5 of the substrate 2 (as described further below), will be electrically connected with each other on the second surface 5 of the substrate 2 and will then together be (re) through connected through the fifth hole 208 from the second surface 5 to the first surface 3 of the substrate 2 so as to be connectable together on a corresponding common (HSS) contact pad 220 (cf. FIGS. 2G and 2J) on the first surface 3 of the substrate 2.

As will also be described further below, the sixth through opening 210 is associated to the gate contact terminal 9' of the first die 9 in a manner that an electrical through contacting which will be provided from the first surface 3 of the substrate 2 (below/overlapped by the first die 9) through the second through opening 202 to the second surface 5 of the substrate 2 will be (re) through connected from the second surface 5 to the first surface 3 of the substrate 2 via the sixth through opening 210 to be there (on the first surface 3 of the substrate 2) electrically connected to a (G1) contact pad 222 (cf. FIGS. 2G and 2J).

As will also be described further below, the drain contact terminal 9' on the second surface 15 of the first die 9 will be electrically connected with a (Vin) contact pad 224 (cf. FIGS. 2G and 2J) provided on the first surface 3 of the substrate 2. The source contact terminal 190' of the second die 190 will be electrically through connected through the third through opening 204 from the second surface 5 (below/overlapped by the second die 190) of the substrate 2 to the first surface 3 of the substrate 2 to be there electrically connected with a (Gnd) contact pad 226 (cf. FIGS. 2G and 2J). And the gate contact terminal 190" of the second die 190 will be electrically through connected via the fourth through hole 206 from the second surface 5 (below/overlapped by the second die 190) of the substrate 2 to the first surface 3 of the substrate 2 to be electrically connected with a (G2) contact pad 228 on the first surface 3 of the substrate 2 (cf. FIG. 2H).

After having the dies 9, 190 placed in the recesses 106 and 108 and aligned with those of their contact terminals 9', 9", 190', 190", which face the substrate 2, to the correspondingly associated plurality of through openings 200, 202, 204, 206, the first and second dies 9, 190 may be bonded to the substrate 2 by curing the applied adhesive to thereby create a die assembly 17 having the dies 9 and 190 fixed in place on the substrate (cf., for example, FIGS. 2E and 2F) and having correspondingly formed opposite first and second surfaces or sides 19, 21. The die assembly 17 may be subjected to pressure or pressure force cross to the surfaces 3, 5 of the substrate 2 during or before curing of the adhesive. As can be seen from FIG. 2F, an edge protection 230 may be applied around the circumferential edge of the first and second dies 9, 190. In this case, such an edge protection 230, for example, prevents copper silicide to be formed between the dies 9, 190 and the first and second copper layers 102, 104 provided on the substrate 2. The edge protection 230 may be formed by an epoxy resin, acrylate or similar polymer.

It is to be noted that the fifth and sixth through openings 208, 210 outside the area(s) where the first and second dies 9, 190 are to be placed may also be formed after placing and bonding the dies 9, 190 to the substrate 2.

Figure 2G:
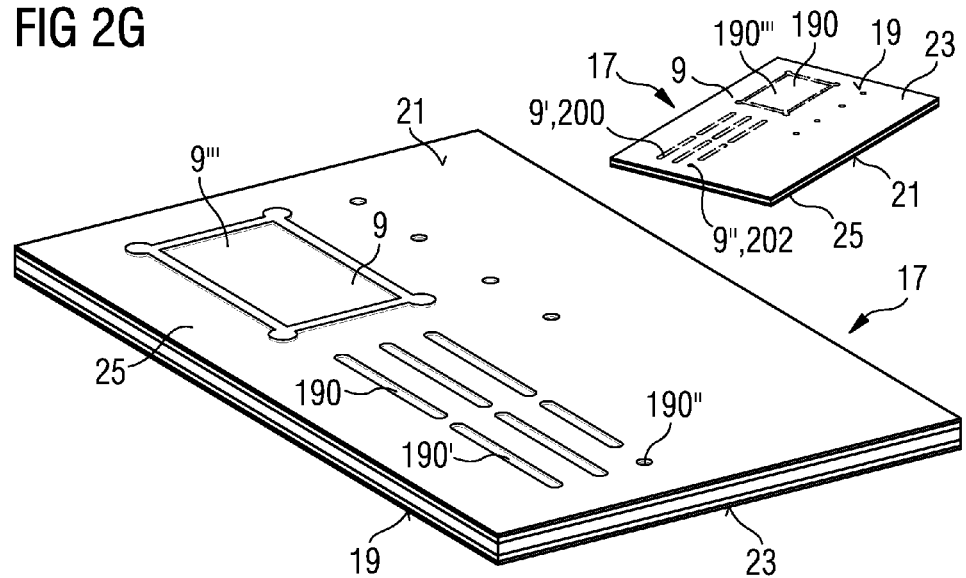

As can be seen from FIG. 2G, the first and second surfaces 19, 21 of the die assembly 17 may then be coated with first and second plating layers 23, 25, respectively, of an electrically conductive material, wherein the respective plating layer 23, 25 may include a seed layer of, for example, electroless copper, carbon/graphite, conductive polymer, etc., and directly coated onto the first and second surfaces 19, 21 of the die assembly 17. In this respect, all available surface, incl. the surfaces within the plurality of through openings 200, 202, 204, 206, 208, 210 may be coated with the seed layer. The said seed layer may then be plated up with an electrically conductive cover layer to finally form the respective first and second plating layer 23, 25. The said cover layer may be made, for example, from electrolytic copper or other electrically conductive material. Thereby, the drain contact terminal 9' of the first die 9 is directly connected to the second plating layer 25 on the second surface 21 of the die assembly 17, the gate and source contact terminals 190', 190'' of the second die 190 are directly electrically through connected via the correspondingly associated third and fourth through openings 204, 206 to the second plating layer 25 which extends into, within and through said third and fourth through openings 204, 206, the drain contact terminal 190''' of the second die 190 is directly electrically connected to the first plating layer 23 on the first surface 19 of the die assembly 17, the gate and source contact terminal 9', 9'' of the first die 9 are directly electrically through connected to the correspondingly associated first and second through openings 200, 202, respectively, to the first plating layer 23 which extends into, within and through said first and second through openings 200, 202.

The thickness of the first and second plating layers 23, 25 each may be in the range from about 10 µm to about 100 µm, or e.g. in the range from about 25 µm to about 75 µm.

Figure 2H:
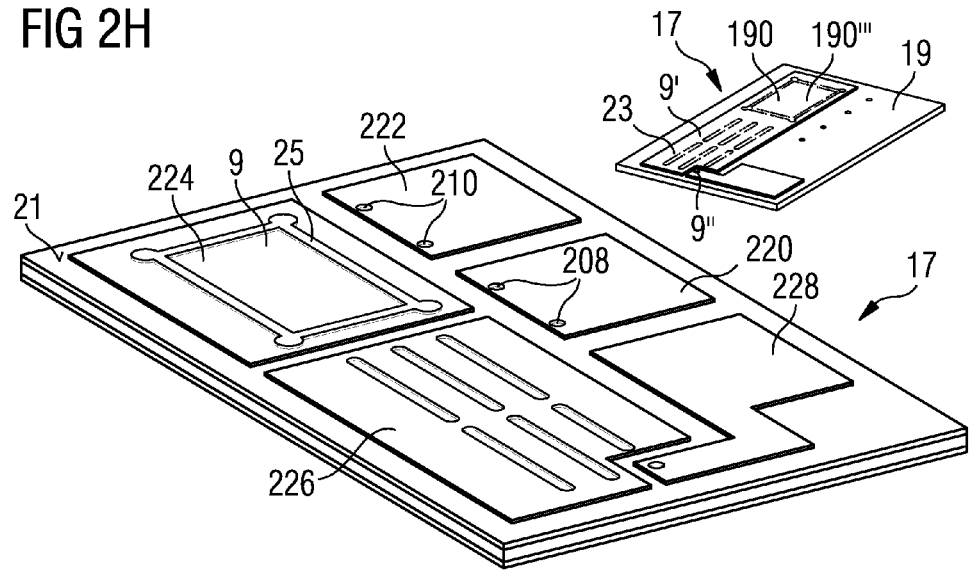

As can be seen from FIG. 2H (larger image), material is removed from the second plating layer 25 on the second surface 21 of the die assembly 17 to create the contact pads 220, 222, 224, 228, 226 which are separated from each other and, hence, do not electrically contact each other. As can be seen from FIG. 2H (smaller image identified as Reverse), material is removed from the first plating layer 23 on the first surface 19 of the die assembly 17 to provide electrical connection lines on the first surface 19 of the die assembly in accordance with the final electrical circuit to be achieved. In this respect, as already explained above, there remains material of the first plating layer 23 such that the drain contact terminal 190' of the second die 190 is electrically connected/coupled to the source contact terminal 9 of the first die 9 on the first surface 19 of the die assembly 17, and such that the gate contact terminal 9'' of the first die 9 is re-through connected to the material of the second plating layer 25 via the sixth through hole 210 at the (G1) contact pad 222, and such that the drain contact terminal 190' of the second die 190 and the source contact terminal 9' of the first die 9 are through connected to the material of the second plating layer 25 via the fifth through opening 208 at the (HSS) contact pad 220.

In accordance with the afore-described process, the final contact pad pattern is provided/formed by removing material from the plating layers 23, 25 which had completely covered the first and second surfaces 19, 23 of the die assembly 17. The removing process may be carried out by means of etching so that a plate and etching process would be applied. However, the desired pattern of the contact pads 220, 222, 224, 226, 228 and the desired pattern of any electrical connection lines of the electrical circuit on the first and second surfaces 19, 21 of the die assembly 17 may alternatively be provided via direct pattern plating using, for example, a plating resist technology. In case of applying a plate and etching process, tin plating may be used as an etch resist, and the tin plating may then be a photo-processed or laser structured.

Figure 2I:
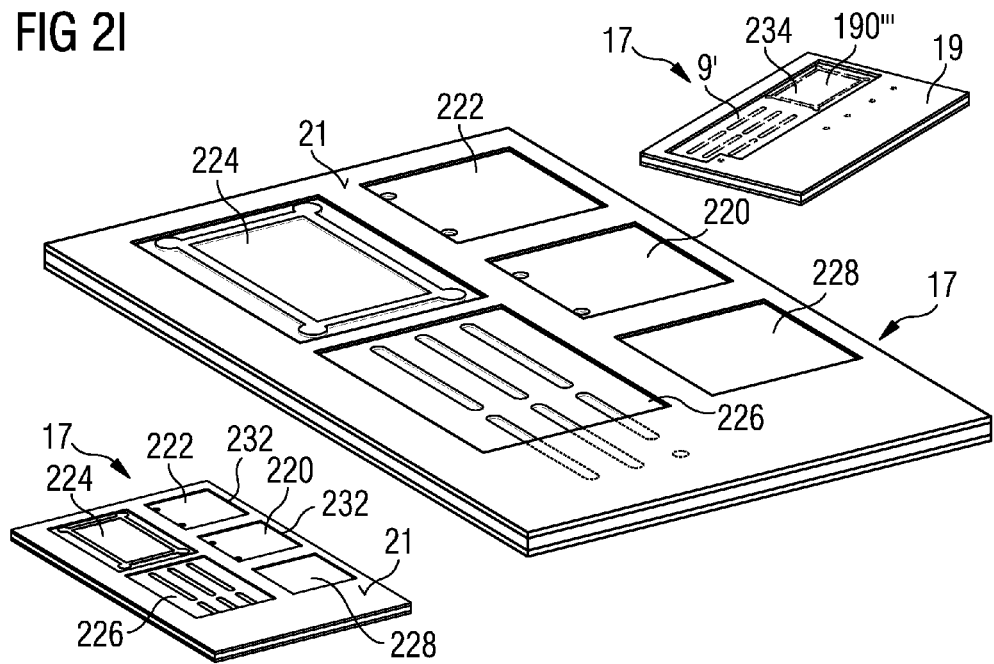

With reference to FIG. 2I (cf. left small image), the contact pads 220, 222, 224, 226 and 228 on the second surface 21 of the die assembly 17 may circumferentially be provided with edge protections 232 which may be of a structure similar to the edge protection 230 of the dies 9, 190. On the first surface 19 of the die assembly 17 a further contact pad 234 may be provided to allow electrical contact of the drain contact terminal 9' of the second die 190 and the source contact terminal 9' of the first die also (that is, in addition to the contact pad 220 on the second surface 21 of the die assembly 17) at the first surface 19 of the die assembly 17. This further contact pad 234 may also be provided with a circumferential edge protection in manner as the contact pads 220, 222, 224, 226, 228 on the second surface 21 of the die assembly 17.

As can be further seen from FIG. 2I, a solder masking process may be carried out, according to which the areas outside and around the contact pads 220, 222, 224, 226, 228 and 234 on both surfaces or sides 19, 21 of the die assembly 17 are covered by a solder. The contact pads 220, 222, 224, 226, 228 and 234 each may be additionally provided with a protective coating, such as an EniG, tin, OSP or Ag coating.

Figure 2J:
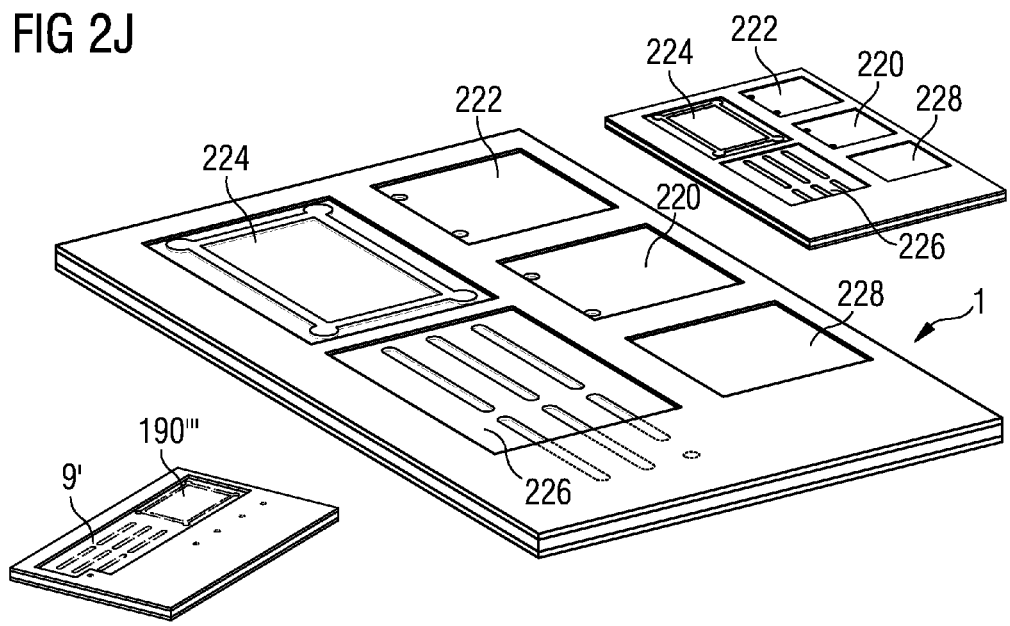

The final semiconductor package 1 manufactured in accordance with the afore-described process and, hence, having a corresponding final structure is depicted in FIG. 2J. As can be derived from this structure, the semiconductor package 1 provides the integration of two power FET'S (for example MOSFET's) creating a synchronous-buck (half bridge). As mentioned above, the node (L-out or further contact pad 234) is directly coupled in this configuration.

It is apparent for one of skill in the art that the invention is not restricted to the structural type of semiconductor packages 1 as described in connection with the above specific embodiments, but the method as described herein may be applied for manufacturing various different structural types of semiconductor packages 1. In this regard, FIGS. 3T and 2B show another structural type of semiconductor package 1 from top and bottom, respectively, manufactured in accordance with the method according to the invention, wherein, in this embodiment, a plurality of through holes 320, 322, 324, 326 and 328 are provided in a substrate 2 in manner so as to extend from a first surface 3 to a second surface 5 of the substrate 2, before one or more dies, here one die 9, are placed on the substrate with the contact terminals on that surface of the one or more dies 9 facing the substrate 2 being aligned to the (correspondingly associated) plurality of through holes 320, 322, 324, 325 and 328, and the one or more dies 9 are then bonded to the substrate 2, here the one die 9 is bonded to the first surface 3 of the substrate 2.

Further, although for example FIGS. 2A-2J describe arrangement/formation of a specific single circuit provided by the semiconductor package 1, it is apparent that a plurality of individual and/or coupled electronic circuits may be placed on the substrate 2, wherein the substrate 2 may then be provided in correspondingly increased dimensions regarding the size of its first and second surfaces 3, 5. In this respect, a plurality of first dies 9 of different and/or same type may be arranged on the first surface 3 of the substrate 2 and/or a plurality of second dies 190 of different and/or same type may be arranged on the second surface 5 of the substrate 2.

Figure 4:
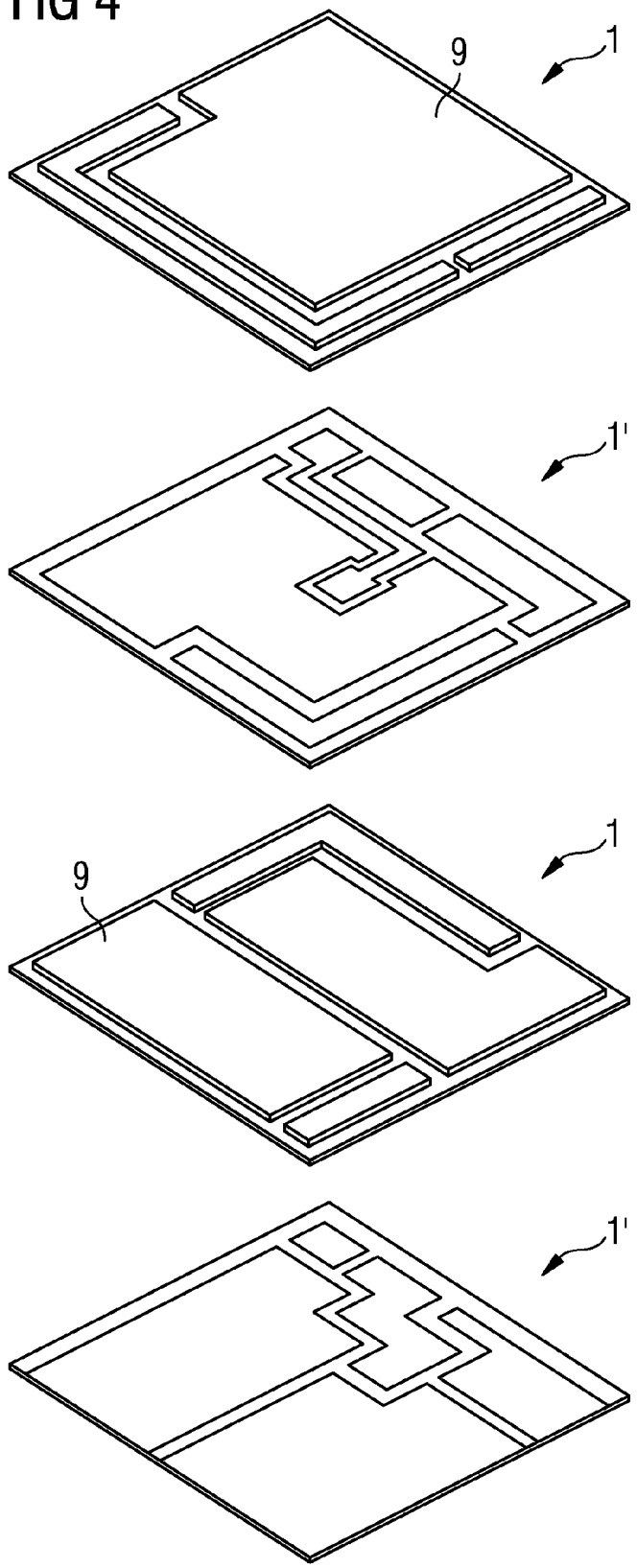

Further, with reference to FIGS. 4 and 5, a plurality of semiconductor packages 1 manufactured in accordance with the method of various embodiments as described herein may be laminated with each other to form a multi-layer semiconductor pack 4 (exploded view of an embodiment of such a pack 4 is shown in FIG. 5) which forms an integral unit of the plurality of semiconductor packages 1. In this respect, FIG. 4 shows top views (left images) and bottom views (right images) of two semiconductor packages 1, 1' manufactured in accordance with the method of various embodiments as described herein, wherein the die or dies provided on the semiconductor packages 1, 1' may be vertically connected to each other in any desired and/or required manner. The respective semiconductor package 1, 1' may include a plurality of individual electronic circuits and, with reference to FIG. 5, may be laminated together with additional redistribution layers 250, 260 therebetween. The semiconductor packages 1, 1' may be joined together using pre-pregs and laid-up in a similar method to conventional PCB (printed circuit board) manufacture. According to FIG. 5, further electrical and/or electronic circuit elements 270, such as electrical connections lines, semiconductor elements, etc., may be provided on the lower surface of said lowest redistribution layer 260.

In the following, various embodiments will be explained on the basis of FIG. 6 which shows a corresponding schematic flow diagram.

According to various embodiments of FIG. 6, a method for manufacturing a semiconductor package includes providing 500 a substrate having opposite first and second surfaces and having one or more through openings formed therethrough from the first to the second surfaces at predefined positions. The respective through opening may be a single through opening or may include a set or a plurality of sub through openings. The one or more through openings are associated to contact terminals, such as a drain, source and gate contact terminals, of a die, such as a FET, or such as contact terminals of other electronic components such as of diodes, capacities, inductors, etc. And, the more or more through openings are provided in pattern corresponding to the pattern of the correspondingly associated contact terminals which are to be placed on the substrate in a manner so as to face the substrate.

Further according to the embodiment of FIG. 6, the method includes providing 510 at least one first die having first and second opposite surfaces and having one or more first contact terminals, such as source, gate and/or drain, on the first surface of the at least one first die and placing 520 the at least one first die with the first surface thereof on the first surface of the substrate, with an adhesive applied therebetween outside the one or more through openings, such that the one or more through openings are aligned to the one or more first contact terminals, whereby a die assembly having correspondingly opposite first and second surfaces is formed. With reference to the previously described embodiments, it is apparent that a plurality of first dies of different and/or same type may be provided and placed with their respective first surface on the first surface of substrate such that the contact terminal or contact terminals provided on the first surface of each first die is/are aligned to the correspondingly associated through opening or through openings of the plurality of through openings. Further, one or a plurality of second dies of different and/or same type may be provided and placed with their respective first surface on the second surface of the substrate (see also further below) such that a contact terminal or contact terminals provided on the first surface of each the second dies is/are aligned to the correspondingly associated through opening or through openings of the plurality of through openings. The one or more first and or second dies may also have one or more contact terminals, such as source, gate and/or drain, on the second surface thereof, which faces away from the substrate.

In addition to the plurality of through openings or as part of said plurality of through openings, one or more through openings may be formed in the substrate which through openings do not directly face the die and, hence, may not directly face their correspondingly associated contact terminals provided on the first surface of the respective die (first and/or second dies), but may be provided outside the circumferential extension of the die. Such through openings laterally outside the position/extension of a die may also be formed in the substrate after the respective die has been placed on and bonded to the substrate. Such through openings outside the circumferential extension of the die or dies placed on the substrate may be used to provide corresponding electrical through contacts in order to, for example, provide a contact between a contact terminals on the first surfaces of the die and the substrate (corresponding to the second surface of the die assembly), which contact is exposed on the second surface of the substrate (corresponding to the first surface of the die assembly) directly below the die, and a contact pad on the first surface of the substrate (corresponding to the second of the die assembly).

Further according to the embodiment of FIG. 6, the method includes providing 530 the first surface of the die assembly, which is on the side of the second surface of the substrate, with a first plating layer of an electrically conductive plating material to electrically contact the one or more first contact terminals, wherein the plating material of the first plating layer extends into, within and through the through openings to electrically contact the one or more first contact terminals therethrough. Those of the one or more through openings which face the first surface of the respective first die and, hence, which are positioned within the circumferential extension of the corresponding die, are filled by the plating material of the first plating layer on the first surface of die assembly (corresponding to the second surface of the substrate) to thereby directly contact the correspondingly associated contact terminal(s) of the one or more die. As mentioned above, there may be through openings outside the circumferential extension of the one or more dies, and the conductive material of first plating layer on the first surface of the die assembly (second surface of the substrate) may extend through these through openings outside the circumferential extension of the die from the first surface to the second surface of the die assembly (from the second surface to the first surface of the substrate) to be there connected to one or more associated contact pads. The second surface of the die assembly, which is on the side of the first surface of the substrate, may be provided 540 with a second plating layer of an electrically conductive material and from which contact pads may be formed. In case of through openings laterally outside of the die or of the dies, the material of the first and second plating layers may both extend into and within these through openings to thereby establish electrical contact between the first and second plating layers allowing the formation of electrical lines to create any desired electrical/electronic circuit between first and second surfaces of the die assembly. That is, as mentioned above, the first and second plating layers allow the creation of contact pads on the first and second sides/surfaces, respectively, of the die assembly (second and first sides/surfaces, respectively, of the substrate) and the through openings laterally outside of the one or more dies allow the creation of electrical connections between contact pads arranged on one surface/side of the die assembly with contact terminals only directly exposed on the respective other/opposite side/surface of the die assembly (that is, with contact terminals of a respective die, which are only directly exposed below the die on the respective other side of the die assembly via the associated through openings in the substrate in the area below/covered by/overlapped by the die.

The contact pads and circuit connection lines and other desired contacts/lines for the desired circuitry may be created from the first and/or second plating layers by removing part of the first and or second plating layers which have been formed on the respective first and second surfaces of the die assembly in manner so as to widely cover these surfaces. That is, the first and/or second plating layers may have been applied to the complete surface area of the first and second surfaces/sides of the die assembly. Alternatively, the desired contact pad/line pattern may also be formed directly, for example, by means of pattern plating using a plating resists. In the latter case, the first and second plating layers are to be understood as being immediately formed as individual contact pads and/or electrical connection lines and/or similar components.

As also mentioned in connection with the previously described embodiments, the respective through openings of the one or of the plurality of through openings may be formed as single through hole or through openings or may be formed by a plurality of sub through holes or sub through openings, the outer circumferential envelope of which sub through openings defining the outer circumferential extension of the corresponding through opening. The single through opening may have an outer circumferential extension corresponding to an outer circumferential extension of the correspondingly associated contact terminal of the correspondingly associated die, which contact terminal and through opening will be arranged directly facing each other or one above the other. In case of sub through openings, their circumferential envelope extension may correspond to the circumferential extension of the correspondingly associated contact terminal of the correspondingly associated die, which contact terminal and through opening will be arranged directly facing each other or one above the other. The respective through opening may, however, also have a circumferential extension different from that of the correspondingly facing contact terminal of the correspondingly associated die. That is, the respective through opening/hole may have any appropriate circumferential shape, such as in form of an elongated slot, a circular hole, a rectangular hole, a triangular hole, an oval hole or any other geometric shape. The respective single through opening or the respective sub through opening may be formed in the afore-mentioned geometrical shapes. In case of sub through openings, different shapes of sub through openings, such as elongated slots, circular holes, rectangular holes, oval holes, triangular holes may be used individually or in combination to form the corresponding through opening/hole.

With reference to FIG. 6, the method may further include providing 550 one or a plurality of second dies having first and second surfaces, and having one or more first contact terminals, such as source, gate and/or drain, on the first surface and optionally one or more second contact terminals on the second surface thereof, such as source, gate and/or drain, and placing 560 the one or more second dies with the first surfaces thereof on the second surface of the substrate with an adhesive applied therebetween, such that the one or more first contact terminals are aligned with the correspondingly associated plurality of through openings formed in the substrate or aligned with the correspondingly associated part of through openings of the overall plurality of through openings formed in the substrate.

The material of a second plating layer provided on the second surface of the die assembly (first surface of the substrate) extends into, within and through the openings associated to the first contact terminals of the respective second die to thereby establish an electrical contact therewith.

The first and/or second plating layers may include an electrically conductive seed layer initially covering the first and/or second surfaces, respectively, of the die assembly and may include a final up-plating as, for example, described in the previous embodiments.

With the creation of contact pads and electrical connection lines from the first and second plating layers the semiconductor package may be finalized. The method may, however, further include providing 570 the first and second surfaces of the die assembly with a soldering mask for protecting the contact pads and providing the contact pads with a conductive protection layer 580 as for example described in the embodiment of FIGS. 2A to 2J.

Various embodiments start the assembly with a pre-patterned plastic carrier. One effect of this is that processing affecting the die may be reduced over other packing concepts (opening apertures to the die surface etc.). The design significantly reduces the number, complexity and cost of each of the processing stages. Various embodiments may also provide benefits for certain applications in which reliability requirements or isolation properties are required. Various embodiments may allow the production of flexible devices and also complex forms in rigid or semi-rigid devices.

Various embodiments use a semi-rigid film with apertures cut through the film (pre-patterned). An adhesive layer may be applied to one side and the die bonded in place (for a discrete this may be gate and source down to the film). Excess adhesive may be removed using a developing process. The assembly may then be coated on both sides with a metallic, electrically conductive seed layer. The assembly may then be electro-plated to form a thick metallization on both sides. The assembly may then be coated with etch resist on both sides and patterned. Effectively this may produce a completed device e.g. in five stages.

Although the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced. Further, the aspects as described in the dependent claims and referring to only a number of previous claims may also be applied to the subject matter of any other of the independent and dependent claims.

What is claimed is:

1. A method for manufacturing a semiconductor package, the method comprising:

providing a substrate having opposite first and second surfaces and having one or more through openings formed therethrough from the first to the second surfaces at predefined positions;

providing at least one first die having first and second opposite surfaces and having one or more first contact terminals on the first surface of the at least one first die;

placing the at least one first die with the first surface thereof on the first surface of the substrate, with an adhesive applied therebetween outside the one or more through openings, such that the one or more through openings are aligned to the one or more first contact terminals, whereby a die assembly having correspondingly opposite first and second surfaces is formed;

providing the first surface of the die assembly with a first plating layer of an electrically conductive plating material to electrically contact the one or more first contact terminals, wherein the plating material of the first plating layer extends in the through openings to electrically contact the one or more first contact terminals therethrough; and removing part of the first plating layer to form at least one individual first contact pad on the first surface of the die assembly, associated to the at least one first contact terminal.

2. The method of claim 1,
wherein the at least one first die is provided with one or more second contact terminals on the second surface of the die, and
wherein the method further comprises providing the second surface of the die assembly with a second plating layer of an electrically conductive plating material to contact the one or more second contact terminals.

3. The method of claim 2, further comprising:
removing part of at least one of the first and second plating layers to form one or more individual first and second contact pads on the at least one of the first and second surfaces of the die assembly, associated with the one or more first and second contact terminals, respectively.

4. The method of claim 2, further comprising:
removing part of at least the first plating layer to form one or more individual first contact pads on at least the first surface of the die assembly, which are associated to the one or more first and second contact terminals, respectively, wherein providing the substrate comprises providing the substrate with a plurality of through openings, the position of which is individually associated to the one or more first and second contact terminals as well as to the individual first contact pads, wherein the first and second plating layers are in electrical contact with each other via that or those of the plurality of through openings, which is or are, respectively, associated to the one or more second contact terminals.

5. The method of claim 1,
wherein the at least one first die is provided with a plurality of first contact terminals on the first surface of the die, wherein the substrate is provided with a plurality of through openings,
wherein the die is placed on the substrate with the plurality of first contact terminals being aligned to the plurality of through openings, and wherein the method further comprises removing part of the first plating layer to form individual contact pads on the first surface of the die assembly associated with the plurality of first contact terminals.

6. The method of claim 1,
wherein a number of the one or more through openings is respectively formed by a plurality of sub through openings, the envelope of which sub through openings forming the outer circumference of the corresponding through opening.

7. The method of claim 1,
wherein a number of the one or more through openings is respectively formed as a single individual through opening.

8. The method of claim 1,
wherein the substrate is a film-type or panel-type substrate.

9. The method of claim 1,
wherein removing part of first layer is carried out by means of etching.

10. The method of claim 2,
wherein the first and second plating layers each comprises a seed layer contacting the at least one first and second contact terminals, respectively, and wherein the first and second plating layers each comprises a up-plating layer covering the corresponding seed layer.

11. The method of claim 1,
wherein the first surface of the substrate is provided with a conductive layer before placing the die thereon, and wherein the conductive layer is provided with a recess at a position where the at least one first die is to be placed.

12. The method claim 1, further comprising:
providing an electrically isolating material along a circumferential die edge of the at least one first die to provide an edge protection electrically isolating the circumferential die edge.

13. The method of claim 1,
wherein the adhesive is applied to only a part of a wholly available surface area defined by the first surfaces of the substrate and the at least one first die, respectively.

14. The method of claim 1,
wherein the substrate is provided with a plurality of openings, the method further comprising:
providing at least one second die having first and second opposite surfaces and having one or more first contact terminals on the first surface of the at least one second die;
placing the at least one first and second dies with the respective first surface thereof on the first and second surfaces of the substrate, respectively, with an adhesive respectively applied therebetween outside the plurality of through openings, such that the one or more through openings are aligned to the one or more first contact terminals of both the at least one first and second dies to form the die assembly having the opposite first and second surfaces;
providing the second surface of the die assembly with a second plating layer of an electrically conductive plating material to electrically contact the one or more first contact terminals of the at least one second die, wherein the plating material of the second plating layer extends in the corresponding through openings to electrically contact the one or more first contact terminals of the at least one second die therethrough.

15. The method of claim 1,
wherein a number of the one or more through openings is formed in the shape of an elongated slot.

16. A method for manufacturing a semiconductor package, the method comprising:
providing a carrier having opposite first and second surfaces and having a plurality of through openings formed therethrough from the first to the second surfaces in a predefined pattern;
providing at least one first die having first and second opposite surfaces and having a plurality of first contact terminals on the first surface of the at least one first die, the first contact terminals being respectively associated to the through openings, and having one or more second contact terminals on the second surface of the at least one first die;

placing the at least one first die with the first surface thereof on the first surface of the carrier, with an adhesive applied between the first surface of the at least one first die and the first surface of the carrier, outside the one or more through openings, such that the plurality of openings are aligned to their associated first contact terminals, whereby a die assembly having corresponding opposite first and second sides is formed; and providing the first and second sides of the die assembly with first and second plating layers, respectively, of a respective electrically conductive plating material to electrically contact the first and second contact terminals, respectively, wherein the plating material of the first plating layer extends through the through openings to electrically contact the one or more first contact terminals.

17. The method of claim 16, wherein at least one second die is provided having first and second opposite surfaces and having a plurality of first contact terminals on the first surface of the at least one second die, and having one or more second contact terminals on the second surface of the at least one second die, wherein the at least one first and seconds dies are placed with the respective first surface thereof on the first and second surfaces, respectively, of the carrier, with an adhesive respectively applied therebetween outside the plurality of through openings, such that the plurality of through openings are aligned to the plurality of first contact terminals of both the at least one first and second dies to form the die assembly having the corresponding opposite first and second sides, and wherein the first and second sides of the die assembly are provided with first and second plating layers, respectively, of a respective electrically conductive plating material to electrically contact the plurality of first contact terminals of the at least one first and second dies, respectively, wherein the plating material of the first and second plating layers extends within the through openings to electrically contact the plurality of first contact terminals of the at least one first and second dies, respectively, therethrough.

18. The method of claim 16, wherein part of the first plating layer is removed such as to form a plurality of first contact pads from the first plating layer, which are associated to the plurality of first contact terminals of the at least one first die.

19. The method of claim 17, wherein part of the first and second plating layers is removed such as to form a plurality of first and second contacts pads from the first and second plating layers, respectively, which first and second contact pads are associated to the plurality of first contact terminals of the at least one first and second dies, respectively.

20. A method for manufacturing a semiconductor package, the method comprising:

providing a die having first and second opposite surfaces, and having one or more first contact terminals arranged on the first surface of the die in accordance with a terminal pattern, and having one or more second contact terminals on the second surface of the die;

providing a substrate having opposite first and second surfaces and having a plurality of openings formed therethrough from the first to the second surfaces in accordance with an opening pattern complying to the terminal pattern;

placing the die with the first surface thereof on the first surface of the substrate, with an adhesive applied therebetween outside the one or more through openings, such that the terminal pattern of the first contact terminals is aligned to the opening pattern of the through openings, and curing the adhesive to bond the die to the substrate to thereby form a die assembly having opposite first and second surfaces; and providing the first and second surfaces of the die assembly with first and second plating layers of a respective electrically conductive plating material to electrically contact the plurality of first contact terminals and the one or more second contact terminals, respectively, wherein the plating material of the first plating layer extends in the through openings to electrically contact the one or more first contact terminals therethrough.

21. A method for manufacturing a semiconductor package, the method comprising:

providing a die having first and second opposite surfaces, and having a plurality of first contact terminals arranged on the first surface of the die at positions so as to form a terminal pattern, and having one or more second contact terminals on the second surface of the die;

providing a substrate having opposite first and second surfaces and having a plurality of openings formed therethrough from the first to the second surfaces at positions so as to form an opening pattern complying with the terminal pattern;

placing the die with the first surface thereof on the first surface of the substrate, with an adhesive applied therebetween outside the one or more through openings, such that the terminal pattern of the first contact terminals is aligned to the opening pattern of the through openings, and curing the adhesive to bond the die to the substrate to thereby form a die assembly having opposite first and second surfaces; and providing the first and second surfaces of the die assembly with first and second plating layers of a respective electrically conductive plating material to electrically contact the plurality of first contact terminals and the one or more second contact terminals, respectively, wherein the plating material of the first plating layer extends in the through openings to electrically contact the one or more first contact terminals therethrough.

22. A method for manufacturing a semiconductor package, the method comprising:

providing a substrate having opposite first and second surfaces and having a plurality of through openings formed therethrough from the first to the second surfaces at predefined positions;

providing one or more first dies each having first and second opposite surfaces and each having one or more first contact terminals on the first surface;

placing the one or more first dies with the first surface thereof on the first surface of the substrate, with an adhesive applied therebetween outside the one or more through openings, such that at least part of the one or plurality of through openings are aligned to the one or more first contact terminals, whereby a die assembly having correspondingly opposite first and second surfaces is formed; and providing the first surface of the die assembly with a first plating layer of an electrically conductive plating material to electrically contact the one or more first contact terminals, wherein the plating material of the first plating layer extends in the through openings to electrically contact the one or more first contact terminals therethrough;

providing one or more second dies each having first and second opposite surfaces and each having one or more first contact terminals on the first surface;

placing the one or more second dies with the first surface thereof on the second surface of the substrate, with an adhesive applied therebetween outside the one or more through openings, such that part of the plurality of through openings are aligned to the one or more first contact terminals of the one or more second dies;

providing the second surface of the die assembly with a second plating layer of an electrically conductive plating material to electrically contact the one or more first contact terminals of the one or more second dies, wherein the plating material of the second plating layer extends in the through openings to electrically contact the one or more first contact terminals of the one or more second dies therethrough.

23. The method of claim 22,
wherein the first plating layer is applied on substantially the wholly available surface area of the first surface of the die assembly, and the method further comprising removing material from the first plating layer so as to form one or more individual contact pads therefrom, which are associated to the one or more first contact terminals of the one or more first dies, or wherein the first plating layer is pattern plated on the first surface of the die assembly to immediately form individual contact pads which are associated to the one or more first contact terminals of the one or more first dies.

* * * * *